United States Patent [19]

Cuomo

[11] 4,414,069
[45] Nov. 8, 1983

[54] NEGATIVE ION BEAM SELECTIVE ETCHING PROCESS

[75] Inventor: Jerome J. Cuomo, Lincolndale, N.Y.

[73] Assignee: International Business Machines Corporation, Armonk, N.Y.

[21] Appl. No.: 393,838

[22] Filed: Jun. 30, 1982

[51] Int. Cl.³ .......................... C23C 15/00; C23F 1/00
[52] U.S. Cl. ................................ 204/192 E; 156/643
[58] Field of Search ..................... 204/192 E; 156/643

[56] References Cited

U.S. PATENT DOCUMENTS 4,132,614 1/1979 Cuomo et al. ............... 204/192 EC
4,250,009 2/1981 Cuomo et al. .................. 204/192 N

OTHER PUBLICATIONS

J. J. Cuomo et al, "Significance of Negative Ion Formation In Sputtering and SIMS Analysis", *J. Vac. Sci. Technol.*, vol. 15, pp. 281–287 (1978).
J. M. E. Harper et al, "Mean Free Path Of Negative Ions In Diode Sputtering", *J. Vac. Sci. Technol.*, vol. 15, pp. 1597–1600 (1978).

Primary Examiner—Aaron Weisstuch
Attorney, Agent, or Firm—Jackson E. Stanland

[57] ABSTRACT

A negative ion etching process is described for etching a substrate, where the negative ions are sputtered from a target by a sputtering gas. The negative ions are released from the target and are accelerated toward the substrate, which they strike as either negative ions or energetic neutrals. The improvement adds an inhibiting substance (hydrogen) to the sputtering gas to dramatically affect the etch rates of the substrate. In one example, the ratio of the etch rates of Si and $SiO_2$ are changed by large amounts by the addition of hydrogen to a sputtering gas comprising an inert species, such as argon.

27 Claims, 5 Drawing Figures

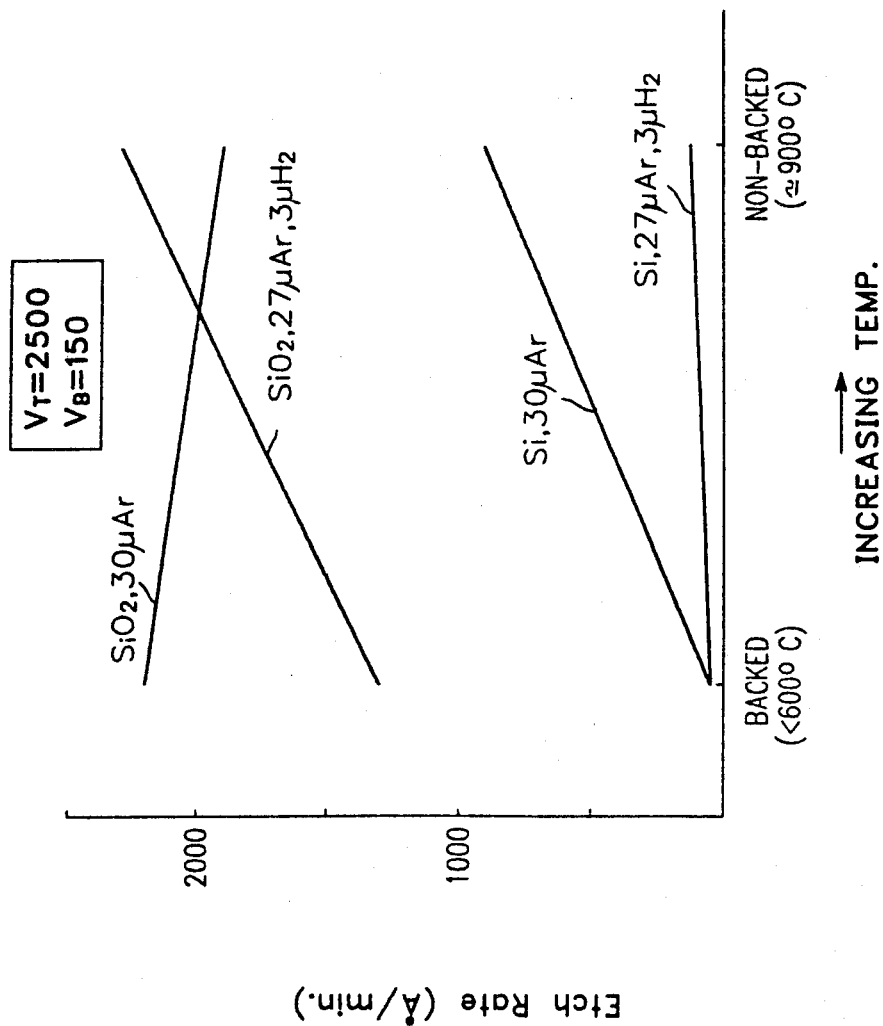

NEGATIVE ION BEAM SELECTIVE ETCHING PROCESS

DESCRIPTION

1. Field of the Invention

This invention relates to a negative ion beam etching process, and more particularly, to such an etching process in which the etching rates of different materials can be changed to provide selective etching.

2. Background Art

Many different techniques are used to etch materials, such techniques having particular importance in the fabrication of micro-electronic devices including semiconductor devices. These etching methods use ion beams, neutral atoms, reactive gases, etc. for the removal of layers of different materials, including metals, insulators, and semiconductors.

In these etching processes the use of an additive gas with the etching species is known for reducing the etch rate, where the amount of the effect on different materials is different.

As an example, U.S. Pat. No. 4,052,251 describes a vapor phase etching process in which silicon is etched by sulfur hexafluoride gas. Hydrogen is introduced into the etchant gas in order to limit the etch rate of silicon.

Another known etching technique using an additive gas to influence etch rate is illustrated in U.S. Pat. No. 4,082,637. In this process, semiconductor devices are sputter etched using an atmosphere of argon and hydrogen, or argon and $H_2O$. The introduction of a gas species developing hydrogen ions reduces the etch rate of metals and semiconductors.

Reactive ion etching involves the use of an active gas such as $CF_4$ or $CCl_4$ in a discharge in order to react with the substrate to produce a volatile product. Sharp anisotropic etching of materials such as Si, $SiO_2$, and metals such as Al, Al-Cu, etc. can be obtained by this technique. Reactive ion etching (RIE) has some selectivity associated with it which is enhanced by gaseous additions such as hydrogen and oxygen. For example, the addition of hydrogen to the etching process inhibits the etching of Si, but $SiO_2$ will be etched in the normal way. Reference is made to British Pat. No. 1,417,085 for a discussion of a RIE process wherein hydrogen or oxygen is added to change the ratio of the etch rates of $SiO_2$ and Si. For example, the etch rate ratio $SiO_2/Si$ is approximately 2/1, when 10% $H_2$ is added to $CF_4$. If 40% $H_2$ is added to $CF_4$, this etch rate ratio is about 20/1.

In the RIE process described in the previous paragraph, it is difficult to provide large etch rate ratios since, as more and more hydrogen or oxygen is added to the active gas, the probability of polymerization increases greatly. For example, if too much hydrogen is added to $CCl_4$, a polymer deposit will form on silicon. This polymer deposit can be removed only if the hydrogen supply is cut off. As noted in British Pat. No. 1,417,085, the introduction of more than 40% hydrogen tends to result in the formation of a polymer deposit.

Negative ions have been found in low discharge sputtering systems and have been used to produce etched substrates by physical sputtering processes, as described in U.S. Pat. Nos. 4,132,614 and 4,250,009, both of which are assigned to the present assignee. In this type of negative ion sputtering process, a highly ionic target is struck by an energetic particle, such as argon atoms, neutrons, ions, or other particles to produce negative ions which are then accelerated to a sample to be etched. The ionic targets are typically compounds which will release negative ion species such as F, Cl, Br, and I. Since the target is at a negative potential and the plaasma surrounding the target is at approximately ground potential, the negative ions from the target will be accelerated by the fall potential (the potential between the negative target and the plasma) to impinge upon the sample (substrate) in order to etch it. Although the negative ion may lose electrons in the plasma, it will be sufficiently accelerated to strike the substrate as an energetic neutral.

Aforementioned U.S. Pat. Nos. 4,132,614 and 4,250,009 describe a negative ion etching process and the different types of apparatus used to practice that process. Additionally, reference is made to J. J. Hanak, et al, "Effect of Secondary Electrons and Negative Ions on Sputtering of Films", *J. Vac. Sci. Tech.*, Vol. 13, pp 406–409 (1976), describing an etching process using fluoride negative ions that were generated during sputtering from a $TbF_3$ target.

Since negative ion etching has advantages in the etching of various materials, it would be desirable to be able to control that process in order to provide selective etching. For example, in the fabrication of semiconductor devices, it is often advantageous to have $SiO_2$ etch at a much more rapid rate than Si. Further, $Si_3N_4$ may also be found on the semiconductor devices and advantages result when $Si_3N_4$ has a different etch rate than those of Si and $SiO_2$. Heretofore, no good way has been taught or suggested for controlling the relative etch rate of different materials in a negative ion etching system. Accordingly, it is a primary object of the present invention to provide a technique for selective etching of different materials in a negative ion etching system.

It is another object of the this invention to provide a straightforward technique for obtaining selective etching of different materials in negative ion etching processes.

It is another object of the present invention to provide a negative ion etching process in which etch rate ratios for different materials can be enhanced without adverse effects, such as the deposit of polymers on the substrate to be etched.

It is a further object of the present invention to provide a technique for enhancing the etch rate ratios of different materials in a negative ion etching process, wherein different effects can be obtained on the etching of different materials.

It is another object of this invention to provide an improved negative ion etching process wherein the etch rates of some materials are enhanced while the etch rates of other materials are reduced, for the same change in the negative ion etching process.

DISCLOSURE OF THE INVENTION

In its broadest sense, this invention is a negative ion etching process in which hydrogen or a hydrogen containing species is introduced into the sputtering gas to cause selective etching of materials. A target which yields negative ions such as those of F, Cl, Br, and I is struck with an ion beam, neutral atoms, or energetic particles, and releases these negative ions. The ions are then accelerated to the substrate where they cause etching. The presence of hydrogen produces a significant effect on the etch rates of different materials in this negative ion etching system.

In a particular example, a semiconductor device comprising layers of silicon (Si), silicon dioxide ($SiO_2$), and silicon nitride ($Si_3N_4$) is etched by this negative ion process. The etch rate ratio $SiO_2$/Si is about 2/1. With a 10% hydrogen addition to an argon sputtering gas, the etch rate of $SiO_2$ decreased by about ½, while the etch rate of Si decreased to 0 Å/min. In the absence of hydrogen, $Si_3N_4$ was etched while it was not etched with a 10% hydrogen addition to the argon sputtering gas. Thus, the process produces extreme etch rate differentials between these different materials.

These and other objects, features, and advantages will be apparent from the following, more particular description of the preferred embodiments.

BRIEF DESCRIPTION OF THE DRAWINGS

FIG. 5 is a plot of the etch rates of Si and $SiO_2$ vs substrate temperature, for a situation in which hydrogen is not present in the sputtering gas and for a situation in which hydrogen is present in the sputtering gas.

BEST MODE FOR CARRYING OUT THE INVENTION

In this description, reference will be made to aforementioned U.S. Pat. Nos. 4,132,614 and 4,250,009. These patents describe negative ion etching processes and suitable apparatus for these processes. Reference is also made to the previously mentioned Hanak et al article and to the references cited by Hanak et al, particularly those to Honig (Refs. 3,4). These patents and those referenced articles describe techniques for producing negative ions. The present invention uses, and incorporates by reference, the teachings of those patents and technical journal articles for the formation of negative ions, where those negative ions are produced by sputtering from a suitable target providing the negative ions. A particular example is the use of an ionic compound target which will yield negative ions of F, Cl, Br, and I.

Figure 1:
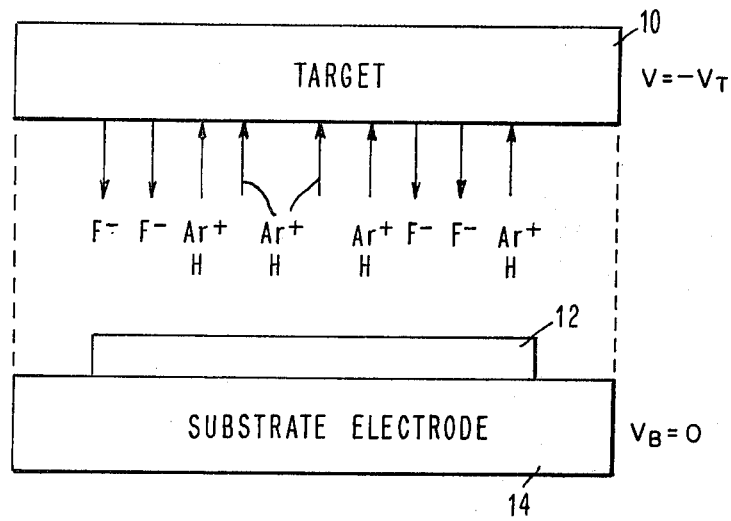
FIG. 1 schematically illustrates the negative ion etching process of this invention where the substrate is aligned substantially parallel to the target providing the negative etching ions.

FIG. 1 illustrates the process of the present invention wherein a target 10 is held at a negative potential -$V_T$ which is measured with respect to the walls of the sputtering chamber (substantially ground). A sputtering gas comprising, substantially, argon ions ($Ar^+$) impinges upon the target 10 to release negative ions therefrom. In the present invention, the sputtering gas includes not only the traditionally used inert gases Ar, Ne, Kr, etc., but also hydrogen. The hydrogen is introduced into the sputtering gas as either $H_2$, or as a material which will yield hydrogen. For example, water vapor and other compounds of hydrogen, preferably gaseous ones, can be used for this purpose. As will be more apparent, the presence of hydrogen in the gas used to sputter negative ions from target 10 dramatically affects the etch rates achieved in a negative ion etching process.

The negative ions released from the target 10, indicated by the arrows $F^-$, are accelerated to the full fall potential (the potential between the negative target and the sputtering gas plasma) to a substrate 12 which is to be etched. The negative ions will often lose electrons in the sputtering gas plasma and strike substrate 12 as energetic neutrals. Substrate 12 is located on a substrate electrode 14, which can have a small negative bias voltage $V_B$, measured with respect to the chamber wall. In this process, negative ions and/or energetic neutrals are used for etching the substrate 12. Positive ions can be prevented from reaching substrate 12 in accordance with the teachings of aforementioned U.S. Pat. No. 4,250,009.

Substrate 12 can be comprised of any material that is to be etched, including metals, insulators, and semiconductors. Particular examples will be described with respect to Si, $SiO_2$, $Si_3N_4$, and $Al_2O_3$. In the practice of this invention, it has been found that the presence of hydrogen in the sputtering gas plasma causes dramatic changes in the relative etch rates of the substrate materials, in a manner which does not lead to the deposit of polymers on the surface of the substrate.

The voltage $V_T$ is a negative voltage whose purpose is to attract positive sputtering gas atoms from the plasma to the target, to cause release of negative ions therefrom. A typical range of $V_T$ is from about -250 V to about -5000 or more volts (with respect to ground). The sputtering ions produce events at the target which result in the release of these negative ions, which are then extracted by the electric field between the target and the plasma.

The bias voltage $V_B$ is also a negative voltage with respect to ground, and typically is about -25 V to -several hundred volts. It is also of a smaller magnitude than $V_T$. Voltage $V_B$ is used to inject electrons into the plasma, thereby enhancing ionization, and thereby also enhancing sputtering of the target.

The hydrogen in the sputtering gas is present in an amount ranging from a few percent to about 50-75 percent, by volume. If the hydrogen is present in too small an amount, the effect on etch rates is very small while, if there is an excessive amount of hydrogen, for example in excess of 80% by volume, sputtering of the target will diminish by a large amount.

Figure 2:
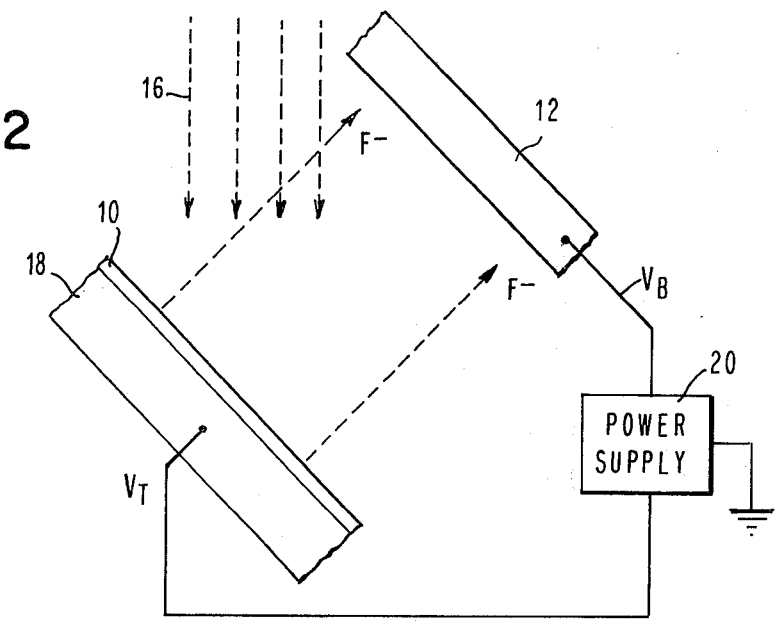
FIG. 2 schematically illustrates the etching process of the present invention where the target providing the negative etching ions is disposed at an angle to the beam 16 used to sputter negative ions from the target.

In FIG. 2, the target 10 is at an angle to the direction of the energetic particle beam 16 used to sputter negative ions from target 10. Beam 16 is produced by known apparatus, as described in U.S. Pat. No. 4,250,009. Substrate 10 is located on a substrate holder (electrode 18) which is connected to a power supply 20, providing the voltage $V_T$. Power supply 20 is also connected to substrate 12 to provide the substrate bias $V_B$. When beam 16 strikes target 10, negative ions will be released and accelerated towards substrate 12, as indicated by the arrows $F^-$.

Energetic particle beam 16 is used to sputter negative ions from the target 10, and contains hydrogen in order to provide selective etching of the substrate. Beam 16 can be comprised of energetic particles such as accelerated Ar atoms, neutrons, ions, and other particles including combinations of atoms and other sub-atomic particles, such as $Ar^+$ ions or the like. Neutral beams 16 are often preferred because they do not generate high electrical currents at the target 10. When an ion beam containing electrons is used, it is often necessary to use means, such as a wire mesh grid, in front of the target to prevent drawing high electrical currents. This is also described in U.S. Pat. No. 4,250,009. The introduction of the sputtering gas (argon, etc.) is in accordance with the teachings of aforementioned patents U.S. Pat. Nos. 4,132,614 and 4,250,009. In the practice of the present invention, hydrogen or a species containing hydrogen is also introduced with the sputtering gas. The pressures, voltages, etc., described herein and in those patents can be used in the practice of the present invention, as is the apparatus described in those patents.

EXAMPLES

Figure 3:
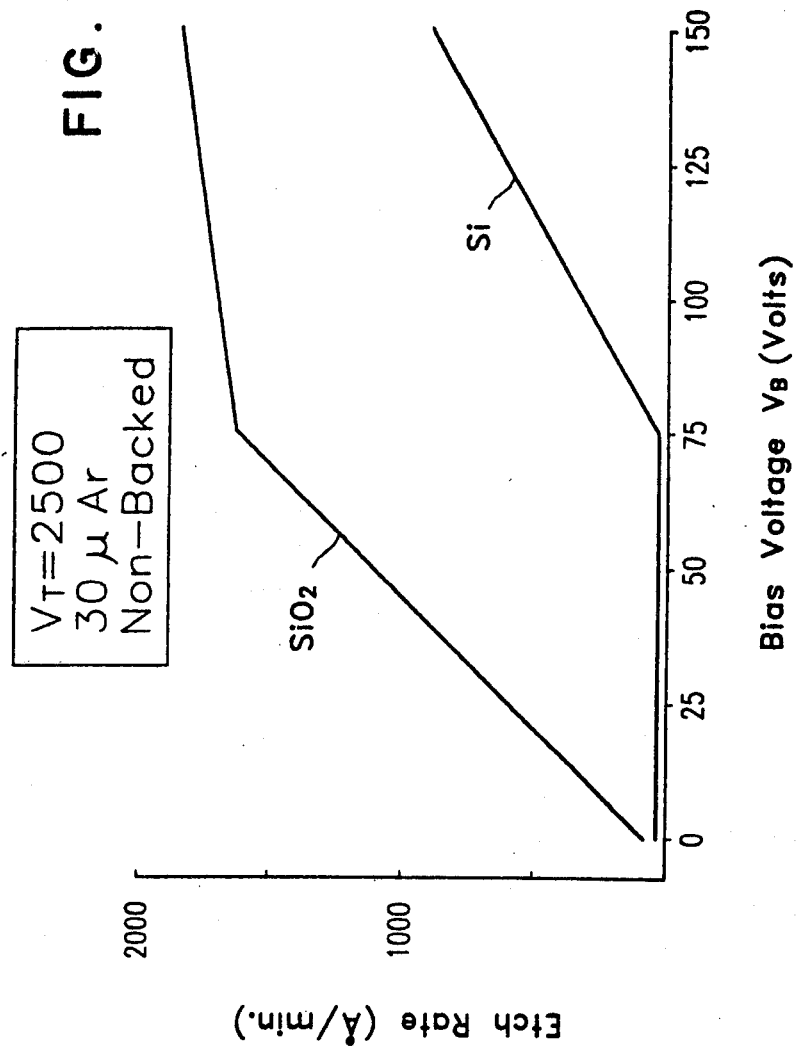
FIG. 3 is a plot of the etch rate of Si and $SiO_2$ vs. bias voltage, for etching of these materials without the presence of hydrogen in the sputtering gas.
Figure 4:
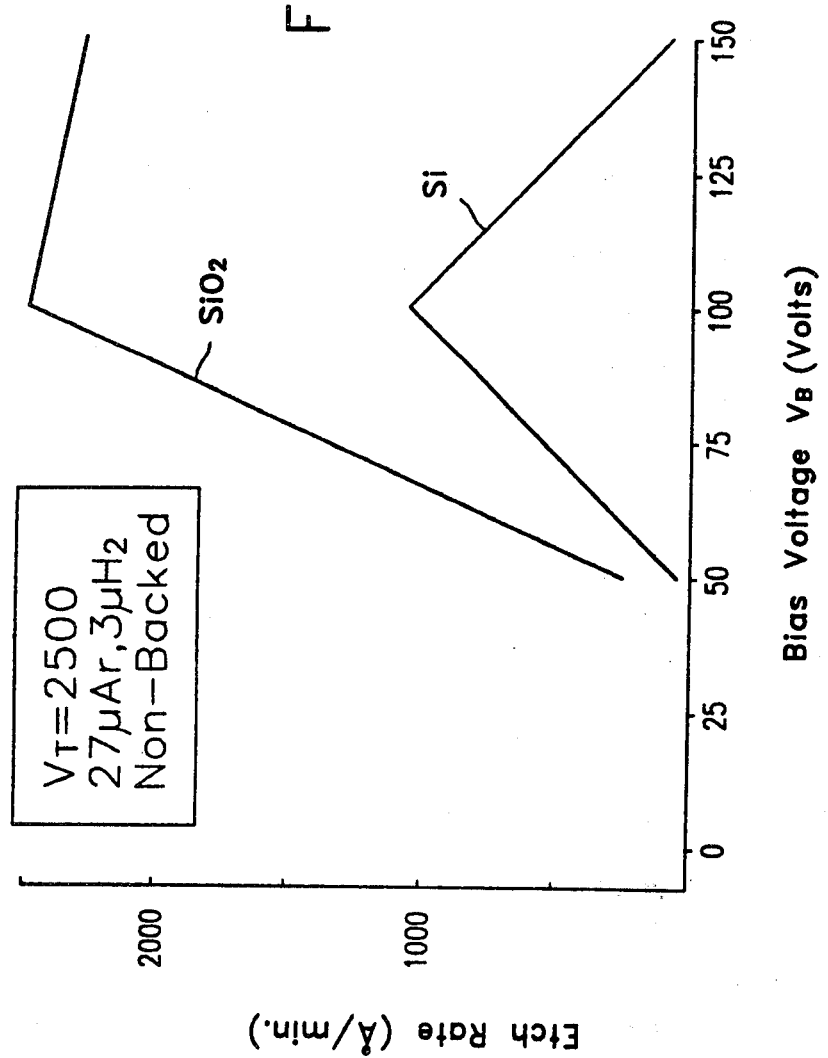
FIG. 4 is a plot of the etch rate of Si and $SiO_2$ as a function of bias voltage when hydrogen is present in the sputtering gas.

FIGS. 3, 4, and 5 are various plots of the etch rates of Si and $SiO_2$ vs. bias voltage (FIGS. 3 and 4) and substrate temperature (FIG. 5). These curves illustrate the effect of the introduction of hydrogen into the sputtering gas and illustrate the striking differentials in etch rates that occur. The data upon which these curves are based is contained in the following table:

dramatically changed. In fact, the etch rate ratio $SiO_2/Si$ is about 2/1 without the hydrogen. With 10% hydrogen added to argon, the ratio is almost infinite.

FIG. 5 plots the etch rates of Si and $SiO_2$ as a function of substrate temperature for the situation when no hydrogen is present and when 10% hydrogen is introduced with the argon. For these curves, $V_T = -2500$ V, while $V_B = -150$ V. Interestingly, the etch rate of $SiO_2$ as a function of substrate temperature changes slope when hydrogen is present with the argon gas. At higher temperatures, slight etching of Si was observed. As will be described later, $Si_3N_4$ becomes unetched in the presence of 10% hydrogen, an effect which is also observed when the substrates are at high temperatures.

$Si_3N_4$ and $Al_2O_3$

Studies were also made of the etching of $Si_3N_4$ and $Al_2O_3$ (sapphire) in this etching apparatus. These results are illustrated in TABLE II.

TABLE II $MgF_2$ Sputter-Etch Series

| Run | Etch Rate Å Min | | | |
|---|---|---|---|---|
| | Si | $Si_3N_4$ | $SiO_2$ | $Al_2O_3$ |
| −13 Ar only, Non-backed | 930 | 780 | 1900 | — |
| −14 Ar only, Backed | ~0 | ~0 | 2220 | — |
| −15 10% $H_2$, Backed | ~0 | ~0 | 1300 | ~0 |
| −16 10% $H_2$, Non-backed | 84 | 57 | 2300 | — |
| −17 Ar only, No bias, Non-backed | 22 | 27 | 98 | 78 |
| −18 10% $O_2$ Non-backed, Ga backing | 194 → 84* −230 (Deposit) | 290 118** | 1400 | 2600 |
| −19 Ar only, 75V bias, Non-backed Ga backing | 0 −283 (Deposit) | 22.2 | 1620 | 1960 |

*etch rate decreased to 84 with decreasing temp.
**290 A/min a/min etching in one area of sample.
118 A/min deposit in another area of sample.

TABLE I

Data Summary - $MgF_2$

| Target Voltage $V_T$ (Volts) | Bias Voltage $V_B$ (Volts) | Gas & Press. | Etch rate (Å/min), E: Non-backed | | | Etch rate (Å/min), E: Backed | | |
|---|---|---|---|---|---|---|---|---|
| | | | $E_{Si}$ | $E_{SiO_2}$ | $E_{SiO_2}/E_{Si}$ | $E_{Si}$ | $E_{SiO_2}$ | $E_{SiO_2}/E_{Si}$ |
| 2500 | 150 | 30μ AR | 930 | 1900 | 2.0 | 0 | 2200 | >200 |
| 2500 | 150 | 27μ AR, 3μ $H_2$ | 84 | 2300 | 27.4 | 0 | 1300 | >150 |
| 2500 | 0 | 30μ Ar | 22 | 98 | 4.5 | | | |
| 2500 | 150 | 27μ AR, 3μ $O_2$ | 194 | 1400 | 7.2 | | | |
| 2500 | 75 | 30μ Ar | 0 | 1620 | >150 | | | |
| 2500 | 100 | 27μ Ar, 3μ $H_2$ | 1070 | 2440 | 2.2 | | | |
| 2500 | 50 | 27μ Ar, 3μ $H_2$ | 61 | 256 | 4.2 | | | |
| 2000 | 150 | 30μ Ar | 31 | 3300 | 106 | | | |

For the data of the table, the target was $MgF_2$. Backed substrates contained a backing of GaIn to provide heat dissipation. This target had a three inch diameter and was shielded to provide a two inch opening for the sputtering plasma. A Mo substrate holder had holes therein filled with $SiO_2$/Si substrate.

In FIG. 3, the target voltage $V_T$ was −2500 V and 30 microns Ar was used as the sputtering gas. The substrates were not backed. No hydrogen was introduced into the sputtering gas. From these curves, it is apparent that the etch rates of both Si and $SiO_2$ increase as the bias voltage $V_B$ increases (i.e., becomes more negative).

FIG. 4 illustrates the situation in which three microns of hydrogen are present in the sputtering gas stream. Again, the substrates are non-backed. As is apparent from FIG. 4, the etch rate of Si decreases much more rapidly than the etch rate of $SiO_2$ when this amount of hydrogen is present. Thus, the etch rate ratio $SiO_2/Si$ is It is observed that the etch rate of hot films of Si is reduced from 930 to 84 Å/min, for the introduction of 10% hydrogen, while the etch rate of hot films of $SiO_2$ is increased from 1900 to 2300 Å/min. The relative etch rate ratio $Si_3N_4$/Si is decreased from 780 to 57 Å/min, for hot films.

For low temperature films, the addition of 10% hydrogen causes the etch rate of silicon to be reduced to approximately 0, while the etch rate of $SiO_2$ is decreased from 2200 to 1300 Å/min. The etch rate ratio $Si_3N_4$/Si is approximately 0. Some data was obtained for the introduction of 10% oxygen to the system. The presence of oxygen often affected the etch rates of these materials.

In the practice of this invention, the presence of hydrogen in the sputtering gas causes visually observable effects. The plasma becomes more brilliant, indicating a higher negative ion yield, such as F⁻ and possibly (HF⁻) in the case of $MgF_2$ targets. Also, the number of secondary electrons emitted from the target appeared to increase, causing further enhancement of the plasma. These effects participate to produce the large effects on etch rates which are observed in this negative ion etching process.

While the invention has been described with respect to selected embodiments thereof, it will be appreciated by those of skill in this art that many variations may be made therein which follow the principles and teachings of this invention.

Having thus described my invention, what I claim as new, and desire to secure by Letters Patent is:

1. In a negative ion etching process, wherein negative ions are sputtered from a target by a sputtering plasma and then are accelerated to a substrate to cause etching therefrom, the improvement wherein hydrogen or a species containing hydrogen is added to said sputtering plasma.

2. The process of claim 1, wherein said negative ions for etching are selected from the group consisting of F, Cl, Br, and I.

3. The process of claim 2, wherein said substrate is a semiconductor.

4. The process of claim 2, wherein said substrate is an insulator.

5. The process of claim 2, wherein said substrate is a metal.

6. The process of claim 2, wherein said substrate includes layers of Si and $SiO_2$.

7. The process of claim 2, wherein said substrate includes layers of Si, $SiO_2$, and $Si_3N_4$.

8. The process of claim 1, wherein said substrate is at a positive potential with respect to said target.

9. The process of claim 1, wherein said sputtering plasma includes an inert gas.

10. The process of claim 1, wherein said target, substrate, and said plasma are contained in a vacuum chamber.

11. The process of claim 1, wherein said target is an ionic compound.

12. A process for etching a substrate, comprising the steps of:
directing a plasma including a sputtering species and hydrogen to a target held at a negative potential $V_T$ with respect to ground to release negative ions therefrom, and
accelerating said negative ions to said substrate to etch said substrate, said substrate having a small negative potential $V_B$ with respect to ground and including layers of different materials, wherein $|V_T| > |V_B|$.

13. The process of claim 12, where said substrate includes layers of Si and $SiO_2$.

14. The process of claim 12, wherein said substrate includes $Al_2O_3$.

15. The process of claim 12, where said substrate includes an oxide layer.

16. The process of claim 12, where said substrate includes a layer of $Si_3N_4$.

17. The process of claim 12, where said plasma includes argon and hydrogen.

18. The process of claim 12, where said target is an ionic compound.

19. The process of claim 12, where said negative ions are selected from the group consisting of F, Cl, Br, and I.

20. The process of claim 12, wherein said substrate includes layers of Si and $SiO_2$, and said plasma is comprised of argon and hydrogen.

21. The process of claim 12, wherein said substrate includes a first layer which has an etch rate that increases when hydrogen is added to said plasma and a second layer whose etch rate decreases when hydrogen is added to said plasma.

22. A process for etching a substrate, comprising the steps of:
producing negative ions by RF sputtering of a target by a plasma including an inhibiting gas,
accelerating said negative ions from said target to a substrate having at least two layers of different materials, for etching said materials,
said inhibiting gas causing the enhancement of etch rate of one of said materials in said substrate and inhibiting the etch rate of the other of said materials in said substrate.

23. The process of claim 22, wherein said substrate has an electrical bias thereon.

24. The process of claim 23, wherein said layers in said substrate are layers of Si and $SiO_2$.

25. The process of claim 24, where said inhibiting gas is hydrogen.

26. The process of claim 25, wherein said negative ions are selected from the group consisting of F, Cl, Br, and I.

27. The process of claim 23, where said substrate includes a semiconductor layer and an insulating layer.

* * * * *